United States Patent [19]

Nishioka et al.

[11] Patent Number: 5,656,852
[45] Date of Patent: Aug. 12, 1997

[54] HIGH-DIELECTRIC-CONSTANT MATERIAL ELECTRODES COMPRISING SIDEWALL SPACERS

[75] Inventors: Yasushiro Nishioka, Tsukuba, Japan; Scott R. Summerfelt, Dallas, Tex.; Kyung-ho Park; Pijush Bhattacharya, both of Tsukuba, Japan

[73] Assignee: Texas Instruments Incorporated, Dallas, Tex.

[21] Appl. No.: 486,565

[22] Filed: Jun. 7, 1995

Related U.S. Application Data

[62] Division of Ser. No. 283,871, Aug. 1, 1994.

[51] Int. Cl.$^6$ ................................ H01L 23/58
[52] U.S. Cl. ................ 257/632; 257/635; 257/636; 257/637
[58] Field of Search ................ 257/632, 635, 257/636, 637, 758, 759, 760, 767, 768, 769

[56] References Cited

U.S. PATENT DOCUMENTS

| | | | |
|---|---|---|---|
| 4,712,125 | 12/1987 | Bhatia et al. | 257/768 |
| 4,904,612 | 2/1990 | Zwicknagl et al. | 257/769 |
| 5,283,204 | 2/1994 | Rhodes et al. | 437/52 |
| 5,293,075 | 3/1994 | Onishi et al. | 257/769 |
| 5,335,138 | 8/1994 | Sandhu et al. | 361/303 |
| 5,381,302 | 1/1995 | Sandhu et al. | 361/305 |
| 5,392,189 | 2/1995 | Fazan et al. | 361/305 |

FOREIGN PATENT DOCUMENTS

| | | |
|---|---|---|
| 44 02 216 A1 | 7/1994 | Germany. |
| 2 274 741 | 1/1994 | United Kingdom. |

OTHER PUBLICATIONS

European Search Report, Nov. 8, 1995.

*Mitsubishi Electric Corporation*, ULSI Laboratory, 1993, Eimori et al., "A Newly Designed Planar Stacked Capacitor Cell With High Dielectric Constant Film For 256Mbit DRAM", pp. 631–634.

*Primary Examiner*—Carl W. Whitehead, Jr.
*Attorney, Agent, or Firm*—Bret J. Petersen; Brian Carlson; Richard L. Donaldson

[57] ABSTRACT

Generally, the present invention utilizes a lower electrode comprising a sidewall spacer to fore a top surface with rounded corners on which HDC material can be deposited without substantial cracking. An important aspect of the present invention is that the sidewall spacer does not reduce the electrical contact surface area between the lower electrode and the HDC material layer as compared to a similar structure containing a lower electrode without a sidewall spacer. One embodiment of the present invention is a microelectronic structure comprising a supporting layer (e.g. Si substrate 30) having a principal surface, a lower electrode overlying the principal surface of the supporting layer, and a high-dielectric-constant material layer (e.g. BST 44) overlying the top surface of the lower electrode. The lower electrode comprises an adhesion layer (e.g TiN 36), an unreactive layer (e.g. Pt 42), a sidewall spacer (e.g. SiO$_2$ 40) and a top surface, with the sidewall spacer causing the top surface to have a rounded corner. The rounded corner of the top surface minimizes crack formation in the high-dielectric-constant material, layer.

14 Claims, 3 Drawing Sheets

HIGH-DIELECTRIC-CONSTANT MATERIAL ELECTRODES COMPRISING SIDEWALL SPACERS

This is a divisional of application Ser. No. 08/283,871 filed Aug. 1, 1994.

CROSS-REFERENCES TO RELATED APPLICATIONS

The following related applications were filed concurrently with the instant application:

| Title | Inventors | Docket/ Serial Number |
| --- | --- | --- |
| Improved High-Dielectric-Constant Material Electrodes Comprising Thin Platinum Layers | Summerfelt, Beratan, Kirlin, Gnade | TI-17950 |
| Improved Electrodes Comprising Conductive Perovskite-Seed Layers for Perovskite Dielectrics | Summerfelt, Beratan | TI-17952 |
| Improved High-Dielectric-Constant Material Electrodes Comprising Thin Ruthenium Dioxide Layers | Summerfelt, Beratan, Kirlin, Gnade | TI-19153 |
| Pre-oxiding High-Dielectric-Constant Material Eletrodes | Nishioka, Summerfelt, Park, Bhattacharya | TI-19189 |
| A Conductive Amorphous-Nitride Barrier Layer for High-Dielectric-Constant Material Electrodes | Summerfelt | TI-19554 |
| A Conductive Exotic-Nitride Barrier Layer for High-Dielectric-Constant Material Electrodes | Summerfelt | TI-19555 |
| A Conductive Noble-Metal-Insulator-Alloy Barrier Layer for High-Dielectric-Constant Material Electrodes | Summerfelt, Nicolet, Reid, Kolawa | TI-19556 |

The following previously filed applications are related to the instant application:

| Title | Inventors | Docket/ Serial Number |
| --- | --- | --- |
| Improved Electrical Connections to Dielectric Materials | Gnade, Summerfelt | 08/009,521 |
| Improved Electrical Connections to Dielectric Materials | Gnade, Summerfelt | 08/260,149 |
| Lightly Donor Doped Electrodes for High-Dielectric-Constant Materials | Summerfelt, Beratan, Gnade | 08/040,946 |
| Lightly Donor Doped Electrodes for High-Dielectric-Constant Materials | Summerfelt, Beratan, Gnade | TI-17660.1 |
| Improved Electrode Interface for High-Dielectric-Constant Materials | Summerfelt, Beratan | 08/041,025 |

FIELD OF THE INVENTION

This invention generally relates to improving electrical connections to materials with high-dielectric-constants, such as in the construction of capacitors.

BACKGROUND OF THE INVENTION

Without limiting the scope of the invention, its background is described in connection with current methods of forming electrical connections to high-dielectric-constant materials, as an example.

The increasing density of integrated circuits (e.g. DRAMs) is increasing the need for materials with high-dielectric-constants to be used in electrical devices such as capacitors. Generally, capacitance is directly related to the surface area of the electrode in contact with the capacitor dielectric, but is not significantly affected by the electrode volume. The current method generally utilized to achieve higher capacitance per unit area is to increase the surface area/unit area by increasing the topography, such as in trench and stack capacitors using $SiO_2$ or $SiO_2/Si_3N_4$ as the dielectric. This approach becomes very difficult in terms of manufacturability for devices such as the 256 Mbit and 1 Gbit DRAMs.

An alternative approach is to use a high permittivity dielectric material. Many perovskite, pyroelectric, ferroelectric, or high-dielectric-constant (hereafter abbreviated HDC) materials such as $(Ba,Sr)TiO_3$ (BST) usually have much larger capacitance densities than standard $SiO_2$—$Si_3N_4$—$SiO_2$ capacitors. Various metals and metallic compounds, and typically noble metals such as Pt and conductive oxides such as $RuO_2$, have been proposed as the electrodes for these HDC materials. To be useful in electronic devices, however, reliable electrical connections should generally be constructed which do not diminish the beneficial properties of these high-dielectric-constant materials.

SUMMARY OF THE INVENTION

As used herein, the term "high-dielectric-constant" means a dielectric constant greater than about 50 at device operating temperature. The deposition of an HDC material usually occurs at high temperature (generally greater than about 500° C.) in an oxygen containing atmosphere. Many electrode materials oxidize and become insulating or otherwise degrade in this type of environment. An initial electrode structure formed prior to the HDC material deposition should be stable both during and after this deposition, while subsequent electrode structures formed after this deposition need only be stable after this deposition.

As mentioned hereinabove, Pt has been suggested for the electrodes of an HDC material layer in standard thin-film (herein defined as generally less than 5 microns (um)) applications. However, although Pt is unreactive with respect to the HDC material, it has been found that it is difficult to use Pt alone as an initial electrode. Pt generally allows oxygen to diffuse through it and hence typically allows neighboring materials to oxidize. In addition, Pt also does not normally stick very well to traditional dielectrics such as $SiO_2$ or $Si_3N_4$, and Pt can rapidly form a silicide at low temperatures. Thus a Ta or TiN layer has been suggested as an adhesion or buffer layer under the Pt electrode. However, during BST deposition, oxygen can possibly diffuse through the Pt and oxidize the adhesion layer and make the adhesion layer less conductive. This may be more of a problem on the sides of the adhesion layer than on the top horizontal surface, since the Pt will generally be thicker on the top, and a better diffusion barrier.

Conductive oxides such as $RuO_2$ have also been suggested for the electrodes of an HDC material layer in standard thin-film applications. Again, although $RuO_2$ is unreactive with respect to the HDC material, it too generally has difficulties. For example, the electrical properties of the structures formed using these oxides are usually inferior to those formed using e.g. Pt. Many than-film applications require a small leakage-current-density in addition to a large capacitance per unit area. The leakage current is sensitive to many variables such as thickness, microstructure, electrodes, electrode geometry and composition. For example, the leakage current of lead zirconium titanate (PZT) using $RuO_2$ electrodes is several orders of magnitude larger than the leakage current of PZT using Pt electrodes. In particular, it appears that the leakage current is controlled by Schottky barriers, and that the smaller leakage current with Pt electrodes appears to be due to the larger work function.

As used herein, the term "unreactive", when used in reference to a material contacting an HDC material, means a material which provides a stable conductive interface to the HDC material during and after processing. Note that when a conductive oxide such as $RuO_2$ is used for the unreactive layer (or another part of the electrode), that layer can also contain unoxidized or partially oxidized Ru. For example, an unreactive layer of Ru which is chemically changed by becoming partially or fully oxidized during the HDC deposition process is still considered unreactive since it still provides a stable conductive interface to the HDC material.

Other structures which have been proposed for standard thin-film structures include alloys of Pt, Pd, Rh as the electrode and oxides made of Re, Os, Rh and Ir as a sticking layer on single crystal Si or poly-Si. A problem with these electrodes is that these oxides are usually not stable next to Si and that these metals typically rapidly form silicides at low temperatures (generally less than about 450° C.). If other associated problems can be avoided or minimized, this type of electrode structure should retain its conductivity even after the deposition of the HDC material if an appropriate adhesion (barrier) layer(s) is used between the conductive oxide and the Si substrate.

Regardless of the specific materials used as the electrodes for HDC materials, some problems especially in area of semiconductor process integration are generally common to all. In particular, it has been discovered that crack formation in the HDC material can occur at the lower and/or upper corners of the lower electrode during (or after) HDC material deposition or annealing. It appears that this crack formation may be due to the stress concentration in the HDC material at the relatively sharp lower electrode corner edges. These cracks can reach from the upper surface of the HDC material layer down to the lower electrode, with detrimental results. For example, if a conductive layer, such as an upper electrode for a capacitor, is deposited on the HDC layer, the capacitor can have substantial leakage or even be shorted between the two electrodes.

Generally, the present invention utilizes a lower electrode comprising a sidewall spacer to form a top surface with rounded corners on which the HDC material can be deposited without substantial cracking. An important aspect of the present invention is that the sidewall spacer does not reduce the electrical contact surface area between the lower electrode and the HDC material layer as compared to a similar structure containing a lower electrode without a sidewall spacer.

Sidewalls have apparently been used in prior art structures, however only with loss of the electrical contact surface area of the lower electrode sides. See T. Eimori et al., "A Newly Designed Planar Stacked Capacitor Cell with High Dielectric Constant Film for 256 Mbit DRAM", International Electronic Device Meeting, IEEE, pp 631–634, Washington D.C., Dec. 5–8, 1993. In the structure of T. Eimori et al., insulating $SiO_2$ sidewalls are formed on the sides of the lower platinum layer, thus preventing use of those sides for contact with the BST, and lowering the capacitance of the device compared to a structure without sidewalls. This should become more significant as new devices with higher component densities are sought. Specifically, it will probably be desirable for the electrode to have a higher aspect ratio than prior art devices in order to achieve a large surface area in contact with the HDC material while minimizing the mount of semiconductor real estate used. As used herein, the term "aspect ratio", when used in reference to the physical dimensions of a structure, means the ratio of the height to the width of a structure.

In some prior art structures, oxygen diffusion during and after the HDC material deposition can cause oxidation of the underlying layers. This may cause deformation of the lower electrode or hillocks in the lower electrode, and in turn cracks in the HDC material. In the present invention, the sidewall spacer generally retards the diffusion of oxygen to the sidewall of the adjacent layer and underlying layers, thus diminishing these problems.

Depending on the materials used, the sidewall spacer of the present invention can generally be formed in various locations with respect to the remainder of the lower electrode without reducing the electrical contact surface area. For example, an insulative sidewall can be formed on the interior of the lower electrode, thus rounding the corners of an overlying unreactive layer but without reducing the lower electrode contact surface area. Current may still flow from the unreactive layer to the substrate through the adhesion layer. As another example, a conductive sidewall spacer can be formed either on the interior or on the exterior of the lower electrode. In the exterior case it is desirable that the sidewall spacer comprise a substantially unreactive material so that the lower electrode contact surface area is not reduced.

One embodiment of the present invention is a microelectronic structure comprising a supporting layer having a principal surface, a lower electrode overlying the principal surface of the supporting layer, and a high-dielectric-constant material layer overlying the top surface of the lower electrode. The lower electrode comprises a sidewall spacer and a top surface, with the sidewall spacer causing the top surface to have a rounded corner. The sidewall spacer does not reduce the electrical contact surface area between the lower electrode and the high-dielectric-constant material layer as compared to a lower electrode without the sidewall spacer. The rounded corner of the top surface minimizes crack formation in the high-dielectric-constant material layer.

A method of forming an embodiment of the present invention comprises forming a supporting layer having a principal surface, forming a lower electrode on the principal surface of the supporting layer, and depositing a high-dielectric-constant material layer on the top surface of the lower electrode. The lower electrode comprises a sidewall spacer and a top surface, with the sidewall spacer causing the top surface to have a rounded corner. The sidewall spacer does not reduce the electrical contact surface area between the lower electrode and the high-dielectric-constant material layer as compared to a lower electrode without the sidewall spacer. The rounded corner of the top surface minimizes crack formation in the high-dielectric-constant material layer.

These are apparently the first microelectronic structures wherein an electrode to an HDC material comprises a sidewall spacer that does not diminish the beneficial properties of the lower electrode or of the HDC material layer.

These structures may also be used for multilayer capacitors and other thin-film devices such as pyroelectric devices (e.g. (uncooled) infrared detectors), non-volatile ferroelectric RAMs (using permanent polarization properties), thin-film piezoelectric and thin-film electro-optic devices.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1:
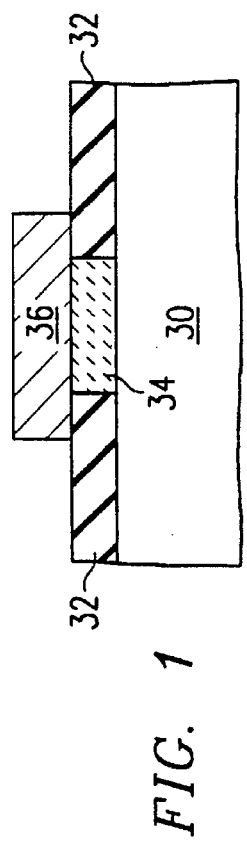
FIGS. 1–5 are cross-sectional views showing the progressive steps in the fabrication of an electrode comprising sidewall spacers, contacting a high-dielectric constant material.

With reference to FIGS. 1–5, there is shown a method of forming an embodiment of the present invention, a lower electrode structure comprising a sidewall spacer and a top surface with rounded corners on which the HDC material can be deposited without substantial cracking. FIG. 1 illustrates a poly-Si plug 34 formed in $SiO_2$ layer 32, overlying silicon semiconductor substrate 30. $SiO_2$ layer 32 may or may not be capped with a diffusion barrier such as $TiO_2$ or $Si_3N_4$. A 100 nm TiN layer 36 overlying the $TiSi_2$/poly-Si plug 34 constitutes the diffusion barrier layer of the lower electrode, and is formed with standard sputtering and etching techniques. A thin $TiSi_2$ layer may be used to improve conductivity between the poly-Si layer and the TiN layer.

Figure 2:
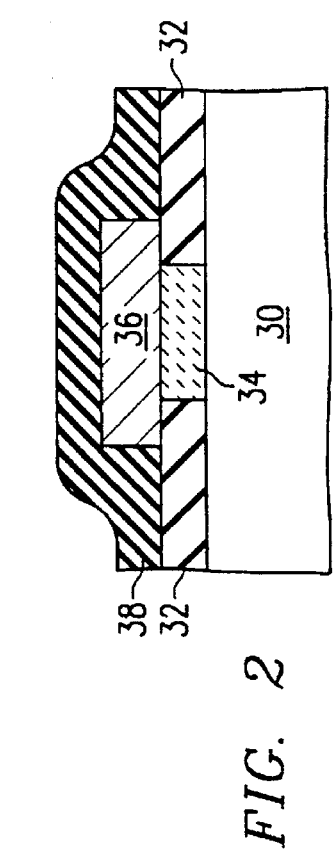
Figure 3:
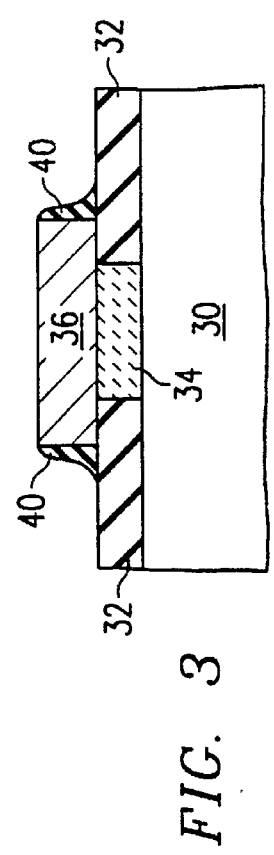

FIG. 2 illustrates the conformal vapor deposition (CVD) of $SiO_2$ layer 38. Other possible deposition methods include sputtering, spin coating etc., as long as the sidewalls of TiN layer 36 are covered. $SiO_2$ layer 38 is then dry etched anisotropically to form sidewall spacer 40 as shown in FIG. 3. The formation of the spacer 40 can also be done by utilizing a wet etching. In this embodiment, $SiO_2$ spacer 40 surrounds TiN layer 36, although this may not be the case for all embodiments. Additionally, there may be more than one spacer formed as part of the lower electrode. As can be seen in FIG. 3, $SiO_2$ spacer 40 rounds the relatively sharp corner edges of TiN layer 36 in preparation for the deposition of the unreactive layer.

Figure 4:
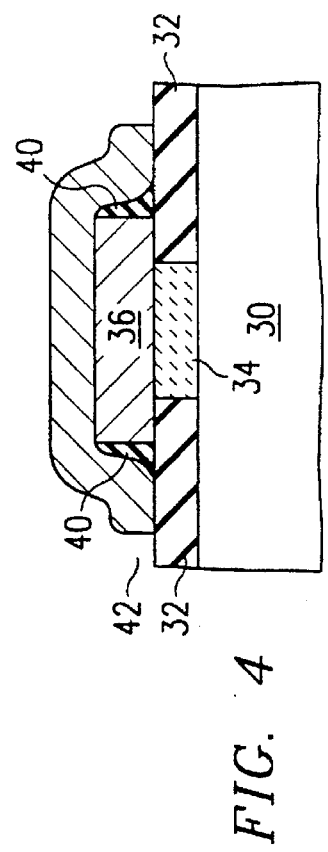

A 200 nm Pt layer 42 is then DC sputter deposited in a 5 mTorr Ar atmosphere using a Pt target with the substrate temperature held at 325° C., resulting in the structure shown in FIG. 4. Pt layer 42 can also be deposited using e-beam evaporation, CVD, or metal organic CVD (MOCVD).

Alternatively, Ru can be deposited and partially or completely converted to $RuO_2$ at the current process step or during subsequent processing steps. The height of Pt layer 42 can vary depending on the desired capacitance density of the HDC material, the total desired capacitance, and the generation of the device. For example, future devices such as 1G DRAMs may generally require taller capacitors to provide more electrode surface area/unit area as compared to 256M DRAM devices, since 1G DRAMs will generally need to provide more capacitance/unit area (due to e.g. increased functionality and shrinking device features). After deposition of Pt layer 42, photoresist is deposited and patterned. Pt layer 42 is then dry etched in a low-pressure, high-density plasma reactive ion etch (RIE) reactor.

The structure is then prepared for the deposition of the high dielectric constant material. This is done since the oxidation rate of adhesion layer 36 is generally much more rapid at the beginning of the HDC deposition process then later. It is therefore beneficial to perform partial oxidation in order let the structure react to less strenuous oxidizing conditions before HDC deposition. For example, if the metal-organic chemical vapor deposition (MOCVD) of the HDC material occurs at 650° C. in 1 Torr $O_2$ for 3 minutes, then the structure should be annealed at 600° C. for 20 minutes in 1 Torr $O_2$ before HDC deposition. The lower temperature generally has some advantage in that it slows the oxidation rate down and allows Pt layer 42 more time to relax than if the oxidation is performed at full deposition temperature. Another benefit of this oxidation anneal process is that Pt layer 42 can rearrange to further round any corners after being etching. This oxidation anneal can also be used with Ru as layer 42 to form an $RuO_2$ shell. Similarly, after subsequent process steps, a capacitor structure with both lower and upper electrodes can be annealed to improve the capacitor properties.

As described hereinabove, BST layer 44 is deposited by MOCVD techniques to form the structure shown in FIG. 5. The deposition may use ionic, photonic, electronic or plasma enhancement. It may also be formed by CVD, sputter or spin coat methods. With the structure of FIG. 5, an insulating $SiO_2$ sidewall spacer 40 is used to form an electrode with a rounded corner, but it does not reduce the electrical contact surface area between Pt layer 42 and BST layer 44. Electrical contact from Pt layer 42 to substrate 30 is made through the top of TiN layer 36.

Figure 5:
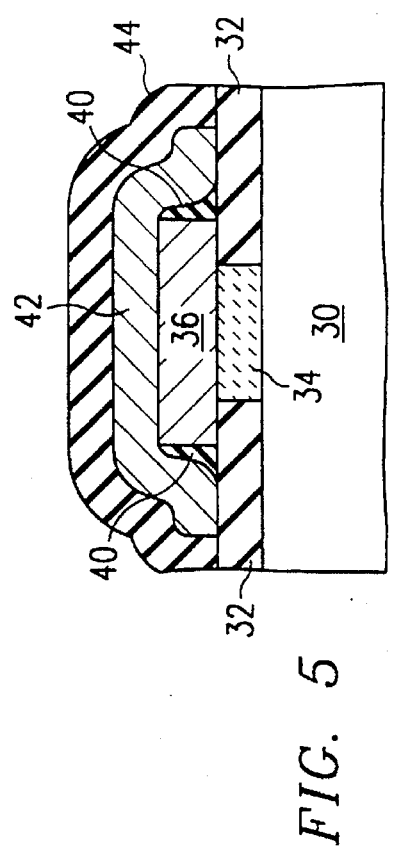
Figure 6:
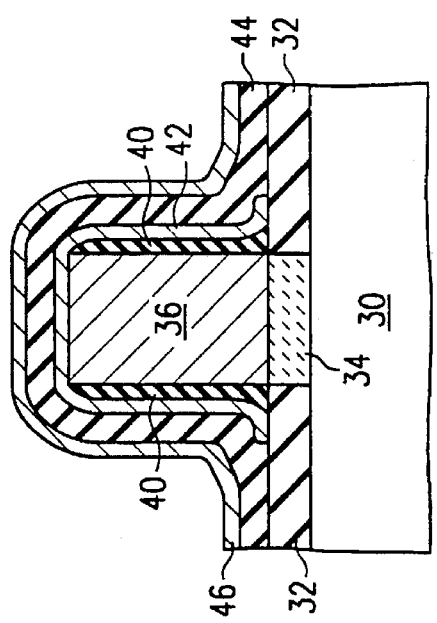
FIG. 6 is a cross-sectional view of a high aspect ratio electrode comprising sidewall spacers, contacting a high-dielectric constant material.

In an alternate embodiment, FIG. 6 illustrates a capacitor with a high aspect ratio, and with a Pt upper electrode layer 46 added. TiN layer 36 has been made substantially higher relative to its width compared to the structure of FIG. 5. This embodiment illustrates the importance of keeping the sidewalls of the lower electrode that are in contact with BST layer 44 conductive. With this type of structure, the nonconductive exterior sidewalls of the prior art would have a very detrimental effect on the capacitor properties.

Figure 7:
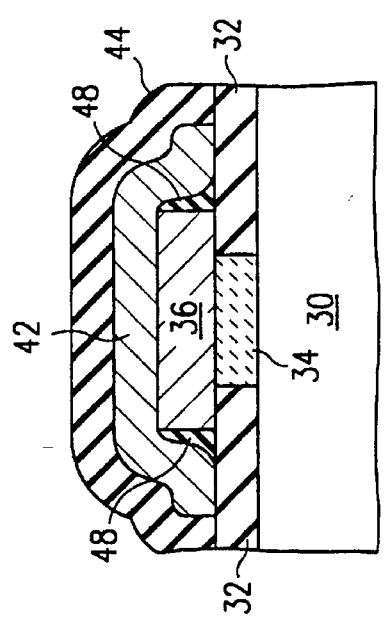
FIG. 7 is a cross-sectional view of an electrode comprising sidewall spacers, contacting a high-dielectric constant material.

In another alternate embodiment, FIG. 7 illustrates a structure similar to that of FIG. 5, except that the insulating $SiO_2$ sidewall spacer has been replaced with conductive TiN sidewall spacer 48. TiN sidewall spacer 48 would be formed with a conformal deposition/anisotropic etch method similar to that used for $SiO_2$ spacer 40 hereinabove.

Figure 8:
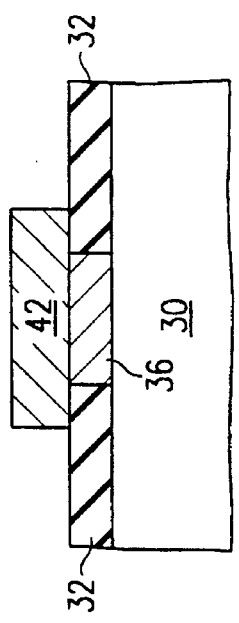
FIGS. 8–12 are cross-sectional views showing the progressive steps in the fabrication of a high-dielectric constant material capacitor with an electrode comprising sidewall spacers.
Figure 9:
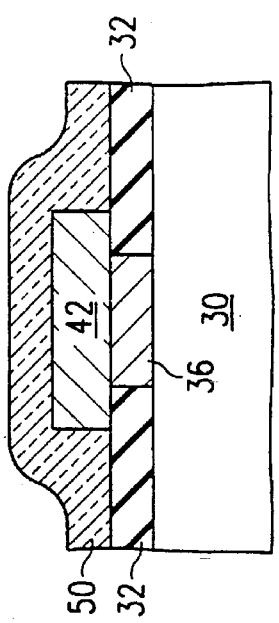
Figure 10:
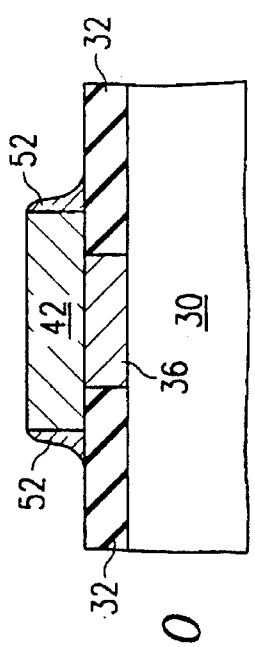

With reference to FIGS. 8–12, there is shown a method of forming another embodiment of the present invention. FIG. 8 illustrates a TiN adhesion layer 36 formed in $SiO_2$ layer 32, overlying silicon semiconductor substrate 30. Also in FIG. 8, Pt layer 42 has been sputter deposited and dry etched to form the unreactive layer of the lower electrode. Referring to FIG. 9, there is shown a conformal Pt layer 50 deposited on the structure of FIG. 8. Pt layer 50 is then dry etched anisotropically to form Pt sidewall spacer 52 as shown in FIG. 10. As can be seen in FIG. 10, Pt spacer 52 rounds the relatively sharp corner edges of Pt layer 42 in preparation for the deposition of the HDC material layer.

Figure 12:
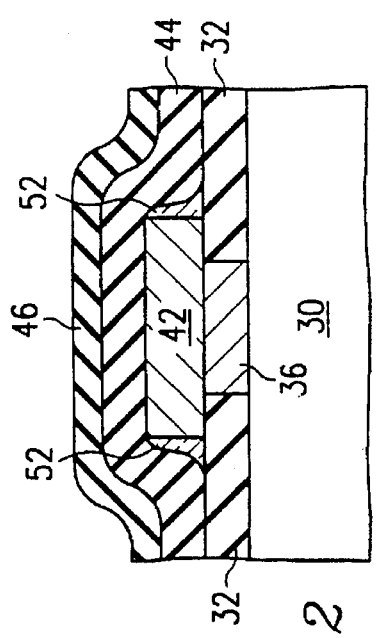
Figure 11:
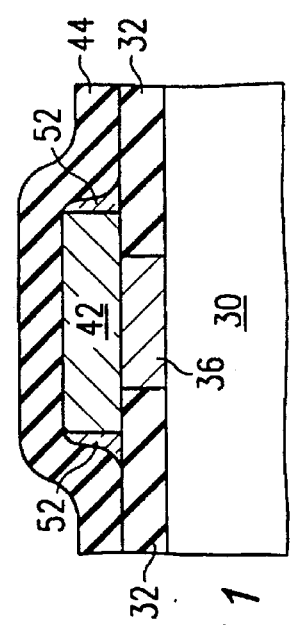

BST layer 44 is then deposited by MOCVD techniques to form the structure shown in FIG. 11, and Pt upper electrode 46 is deposited to form the capacitor structure shown in FIG. 12. With the structure of FIG. 12, a conductive Pt sidewall spacer 52 is used to form an electrode with a rounded corner. Since Pt spacer 52 is on the exterior of the lower electrode, it is important that it remain conductive so that it does not reduce the electrical contact surface area between the lower electrode and BST layer 44. Thus an unreactive material such as Pt, Pd or Ru/RuO$_2$ is preferred for sidewall spacer 52.

Figure 14:
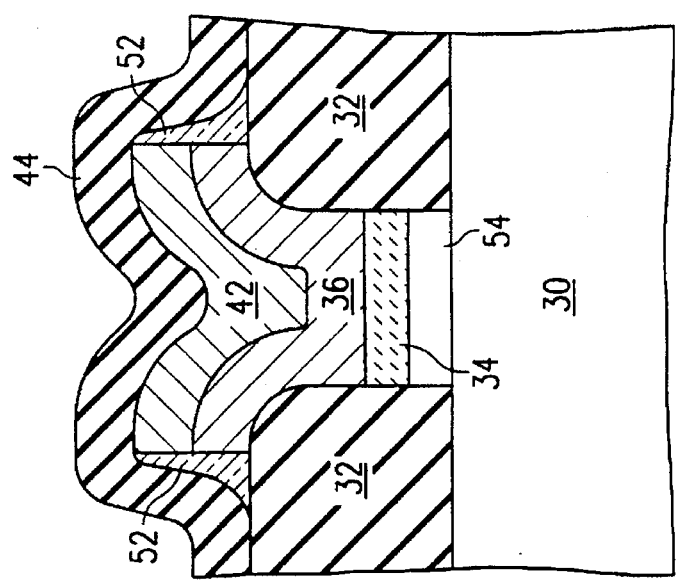
FIGS. 13–14 are cross-sectional views showing progressive steps in the fabrication of a high-dielectric constant material stacked capacitor with an electrode comprising sidewall spacers.
Figure 13:
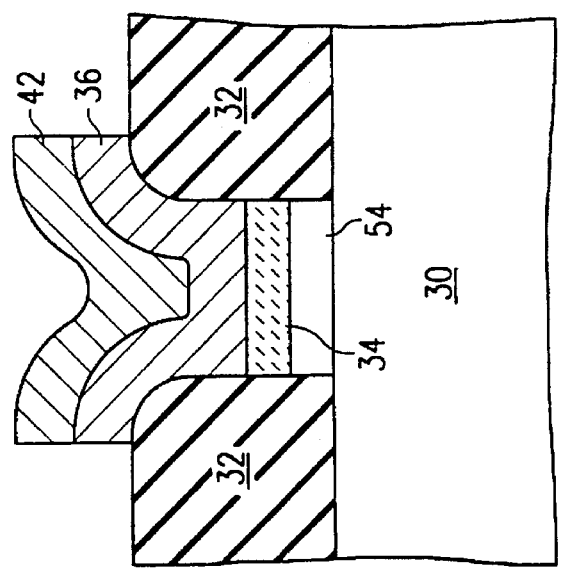

With reference to FIGS. 13–14, there is shown a method of forming yet another embodiment of the present invention, utilizing a stacked capacitor structure. In this embodiment, an adhesion layer has been formed with TiN layer 36 overlying TiSi$_2$ layer 34 in turn overlying poly-Si layer 54. With the standard process, 10 nm of Ti is sputter deposited on poly-Si followed by an N$_2$ rapid thermal anneal (700° C. for 30 seconds) or NH$_3$ furnace anneal (575° C. for 10 minutes). This forms the TiN/TiSi$_x$/poly-Si structure shown in FIG. 13. The TiN is then selectively removed chemically using peroxide. In an alternate method, a vapor HF clean of the poly-Si layer 54 is performed immediately prior to the deposition of TiN layer 36, without using TiSi$_2$ layer 34. It is beneficial that the structure not be exposed to a contaiminating environment, such as the atmosphere, between the HF clean and the adhesion layer deposition process steps, in order to ensure good adhesion between the poly-Si and the TiN layer.

Pt layer 42 has been sputter deposited on TiN layer 36 and subsequently dry etched to form the unreactive layer of the lower electrode. As described hereinabove, a conformal Pt layer is deposited on the structure of FIG. 13, and is then dry etched anisotropically to form Pt sidewall spacer 52 as shown in FIG. 14. As can be seen in FIG. 14, Pt spacer 52 rounds the relatively sharp corner edges of Pt layer 42 and TiN layer 36 in preparation for the deposition of the HDC material layer. BST layer 44 is then deposited on Pt layer 42 and on Pt sidewall spacer 52 by MOD techniques, thus minimizing stress and cracking in BST layer 44.

The sole Table, below, provides an overview of some embodiments and the drawings.

TABLE

| Drawing Element | Preferred or Specific Examples | Generic Term | Other Alternate Examples |
|---|---|---|---|
| 30 | Silicon | Substrate | Other single component semiconductors (e.g. germanium, diamond) Compound semiconductors (e.g. GaAs, InP, Si/Ge, SiC) Ceramic substrates |
| 32 | Silicon dioxide | First level insulator | Other insulators (e.g. silicon nitride) Doped insulators (e.g. BSG, PSG, BPSG) May be more than one layer (e.g. Si$_3$N$_4$ barrier over SiO$_2$ May or may not be used (i.e. first |

TABLE-continued

| Drawing Element | Preferred or Specific Examples | Generic Term | Other Alternate Examples |
|---|---|---|---|
| | | | level insulator, substrate, another insulating layer or a combination thereof may be the supporting layer for the lower electrode) Combinations of the above materials |
| 36 | TiN | Adhesion layer | Other conductive metal compounds |
| 36/34 | TiN/(TiSi$_x$)/poly-Si | | (e.g. oxides: ruthenium oxide, osmium oxide, rhodium oxide, iridium oxide, indium oxide, tin oxide) Conductive metals (different from specific material selected for drawing element 42 below) (e.g. tungsten, tantalum, titanium, tin, ruthenium, indium, osmium, rhodium, iridium) Ternary (or greater) amorphous nitrides (e.g. Ta-Si-N, Ti-Si-N, Ta-B-N, Ti-B-N) Exotic conductive nitrides (e.g. titanium aluminum nitride Zr nitride, Hf nitride, Y nitride, Sc nitride, La nitride and other rare earth nitrides, N deficient Al nitride, doped Al nitride, Mg nitride, Ca nitride, Sr nitride, Ba nitride) Alloys of the above exotic conductive nitrides with common Si processing materials such as TiN, GaN, Ni nitride, Co nitride, Ta nitride, W nitride (e.g. Ta-Al-N) Noble metal insulator alloys (e.g. Pd-Si-N, Pt-Si-N, Pd-Si-O, Pd-Si-O, Pd-B-(O,N), Pd-Al-N, Ru-Si-(O,N), Ir-Si-O, Re-Si-N, Rh-Al-O, Au-Si-N, Ag-Si-N) |
| 36/34/54 | TiN/TiSi$_x$/poly-Si | | |
| | | Adhesion layer (continued) | May be multiple layers (e.g. TiN/TiSi$_x$,TiN/TiSi$_y$/poly-Si) Other silicides may be used in a composite structure (Ni silicide, Co silicide, tungsten silicide) May be a layer having relatively better barrier properties over a layer having relatively better adhesive properties (e.g. Ru/TiN) Combinations of the above materials |
| 38 | SiO$_2$ | Conformal layer | Other conformally deposited insulating materials (e.g. Si$_3$N$_4$) |
| 50 | Pt | | Conformally deposited metals (e.g. platinum, palladium, iridium, rhenium, rhodium) Conformally deposited conductive oxides (e.g. tin oxide, indium oxide, iridium oxide, ruthenium oxide, indium tin oxide) Conformally deposited conductive nitrides (e.g. titanium nitride, zirconium nitride, hafnium nitride, tantalum nitride) Other materials from drawing element 36 above or drawing |

TABLE-continued

| Drawing Element | Preferred or Specific Examples | Generic Term | Other Alternate Examples |
|---|---|---|---|
| | | | element 42 below Combinations of the above materials |
| 40 | $SiO_2$ | Sidewall spacer | Materials from drawing element 38 above |
| 48 | TiN | | |
| 52 | Platinum | | |
| 42 | Platinum | Unreactive layer | Other noble or platinum group metals (e.g. palladium, iridium, rhenium, rhodium, gold, silver) Conductive metal compounds (e.g. oxides: ruthenium oxide, tin oxide, titanium monoxide, indium oxide, rhenium oxide, osmium oxide, rhodium oxide, iridium oxide; doped oxides: doped tin, indium or zinc oxide; nitrides: ruthenium nitride, tin nitride, titanium nitride, zirconium nitride) Conductive perovskite like materials (e.g. $YBa_2Cu_3O_{7-x}$, $(La,Sr)CoO_3$, $SrRuO_3$) Combinations of the above materials Layers of the above materials |
| 44 | Barium strontium titanate | High-dielectric-constant material layer | Other perovskite, pyroelectric, ferroelectric, or high-dielectric-constant oxides (e.g. $(Ba,SrCa,Pb)(Ti,Zr)O_3$, $(Pb,La)(Zr,Ti)O_3$,bismuth titanate, potassium tantalate, lead scandium tantalate, lead niobate, potassium niobate, lead zinc niobate, lead magnesium niobate, tantalum pentoxide, yttrium oxide) Donor, acceptor, or donor and acceptor doped oixdes listed above Combinations of the above materials Layers of the above materials |
| 46 | Platinum | Upper electrode | Conductive metal componds (e.g. nitrides: titanium nitride, ruthenium nitride, tin nitride, zirconium nitride; oxides: ruthenium dioxide, tin oxide, zinc oxide, doped zinc oxide, iridium oxide; silicides: titanium silicide, tantalum silicide, tungsten silicide, molybdenum silicide, nickel silicide; carbides: tantalum carbide borides: titanium boride) Other noble or platinum group metals (e.g. palladium, ruthenium, rhodium, gold, iridium, silver) Reactive metals (e.g. tungsten, tantalum, titanium, molybdenum) Other common semiconductor electrodes (e.g. aluminum, doped Si or Ge) Combinations of the above materials May contain more than one layer |

A few preferred embodiments have been described in detail hereinabove. It is to be understood that the scope of the invention also comprehends embodiments different from those described, yet within the scope of the claims. With reference to the structures described, electrical connections to such structures can be ohmic, rectifying, capacitive, direct or indirect, via intervening circuits or otherwise. Implementation is contemplated in discrete components or fully integrated circuits in silicon, germanium, gallium arsenide, or other electronic materials families. In general the preferred or specific examples are preferred over the other alternate examples. Some components of the lower electrode may sometimes be referred to as being part of the electrode and may sometimes be referred to as being interior to, exterior to, inside of, outside of, on, under, etc. the electrode; the structures and methods of the present invention are substantially the same in either case.

The adhesion layer may comprise other materials than those listed in the table but which are generally less preferred than those materials in the table. For example, the adhesion layer may Comprise other metal compounds such as ruthenium nitride, tin nitride, tungsten nitride, tantalum nitride, titanium oxide, TiON, titanium silicide, tantalum silicide, tungsten silicide, molybdenum silicide, nickel silicide, cobalt silicide, iron silicide, chromium silicide, boron carbide, tantalum carbide, titanium carbide, zirconium carbide, titanium boride or zircon into boride. Alternatively, the adhesion layer may comprise other conductive metals (different from the specific material selected for drawing element 38) such as cobalt, iron, chromium, palladium, rhenium, zirconium, hafnium or molybdenum. Alternatively, the adhesion layer may comprise single component semiconductors such as single- or poly-crystalline silicon or germanium, or compound semiconductors such as GaAs, InP, Si/Ge or SiC.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microelectronic capacitor structure, comprising:
   (a) a supporting layer having a principal surface;
   (b) an adhesion layer on said principle surface, said adhesion layer comprising a lateral surface and an upper surface forming a corner edge;
   (c) a sidewall spacer adjacent said lateral surface of said adhesion layer, said sidewall spacer abutting said corner edge;
   (d) an unreactive layer on said adhesion layer and on said sidewall spacer, said unreactive layer having a rounded corner overlying said corner edge;
   (e) a high-dielectric-constant material layer on said unreactive layer, whereby the rounded corner of the unreactive layer inhibits crack formation in the high-dielectric-constant material layer; and
   (f) an upper electrode on said high-dielectric-constant material layer to form a capacitor structure.

2. The structure according to claim 1, wherein a lower potion of said adhesion layer is laterally surrounded by a first level insulator.

3. The structure according to claim 1, wherein said sidewall spacer comprises an insulating material.

4. The structure according to claim 1, wherein said sidewall spacer comprises a conducting material.

5. The structure according to claim 1, wherein said sidewall spacer is selected from the group consisting of:

platinum, palladium, iridium, rhenium, rhodium, tin oxide, indium oxide, iridium oxide, ruthenium oxide, indium tin oxide, titanium nitride, zirconium nitride, hafnium nitride, tantalum nitride, silicon dioxide, silicon nitride, and combinations thereof.

6. The structure according to claims 1, wherein said adhesion layer is selected from the group consisting of: conductive metals, conductive metal nitrides, conductive metal oxides, conductive metal silicides, conductive metal carbides, conductive metal borides, ternary amorphous nitrides, and combinations thereof.

7. The structure according to claim 1, further comprising an upper platinum electrode on said high-dielectric-constant material layer.

8. The structure according to claim 1, further comprising said sidewall spacer adjacent a second lateral surface of said adhesion layer and a lower portion of said adhesion layer is laterally surrounded by a first level insulator.

9. A microelectronic structure, comprising:

(a) a supporting layer having a principal surface;

(b) an adhesion layer on said principle surface;

(c) an unreactive layer on said adhesion layer, said unreactive layer having a lateral surface and an upper surface forming a corner edge, (d) a conductive sidewall spacer adjacent said lateral surface of said unreactive layer using the same material as used for the unreactive layer, said sidewall spacer abutting said corner edge to form a rounded corner; and (e) a high-dielectric-constant material layer on said unreactive layer and on said sidewall spacer, whereby the rounded corner inhibits crack formation in the high-dielectric-constant material layer.

10. The structure according to claim 9, wherein a lower portion of said adhesion layer is laterally surrounded by a first level insulator.

11. The structure according to claim 9, wherein said sidewall spacer is selected from the group consisting of: platinum, palladium, iridium, rhenium, rhodium, tin oxide, indium oxide, iridium oxide, ruthenium oxide, indium tin oxide, titanium nitride, zirconium nitride, hafnium nitride, tantalum nitride, silicon dioxide, silicon nitride, and combinations thereof.

12. The structure according to claim 9, wherein said adhesion layer is selected from the group consisting of: conductive metals, conductive metal nitrides, conductive metal oxides, conductive metal silicides, conductive metal carbides, conductive metal borides, ternary amorphous nitrides, and combinations thereof.

13. The structure according to claim 9, further comprising an upper platinum electrode on said high-dielectric-constant material layer.

14. The structure according to claim 9, further comprising said sidewall spacer adjacent a second lateral surface of said adhesion layer and a lower portion of said adhesion layer is laterally surrounded by a first level insulator.

* * * * *